(12) United States Patent
Wittenburg et al.

(10) Patent No.: US 8,301,825 B2
(45) Date of Patent: Oct. 30, 2012

(54) METHOD AND SYSTEM FOR STORING LOGICAL DATA BLOCKS INTO FLASH-BLOCKS IN MULTIPLE NON-VOLATILE MEMORIES WHICH ARE CONNECTED TO AT LEAST ONE COMMON DATA I/O BUS

(75) Inventors: Jens Peter Wittenburg, Isernhagen (DE); Thomas Brune, Hannover (DE)

(73) Assignee: Thomson Licensing, Boulogne-Billancourt (FR)

( * ) Notice: Subject to any disclaimer, the term of this patent is extended or adjusted under 35 U.S.C. 154(b) by 909 days.

(21) Appl. No.: 11/918,164

(22) PCT Filed: Mar. 20, 2006

(86) PCT No.: PCT/EP2006/060865
§ 371 (c)(1),
(2), (4) Date: Oct. 10, 2007

(87) PCT Pub. No.: WO2006/108755
PCT Pub. Date: Oct. 19, 2006

(65) Prior Publication Data
US 2009/0043948 A1    Feb. 12, 2009

(30) Foreign Application Priority Data

Apr. 15, 2005  (EP) .................................. 05090111

(51) Int. Cl.
*G06F 12/00*  (2006.01)
(52) U.S. Cl. ........................................ 711/103; 711/154
(58) Field of Classification Search .................. 711/103, 711/154
See application file for complete search history.

(56) References Cited

U.S. PATENT DOCUMENTS 6,405,279 B1    6/2002  Kondo et al.
(Continued)

FOREIGN PATENT DOCUMENTS

| EP | 0646869 | 4/1995 |
|---|---|---|
| JP | 6301601 | 10/1994 |

(Continued)

OTHER PUBLICATIONS

Search Report Dated Jun. 30, 2006.

*Primary Examiner* — Matthew Bradley
(74) *Attorney, Agent, or Firm* — Tutunjian & Bitetto, P.C.

(57) ABSTRACT

For recording or replaying in real-time digital HDTV signals very fast memories are required. For storage of streaming HD video data NAND flash memory based systems can be used. However, NAND flash memories have a slow write access, and they have unmasked production defects. Write or read operations can be carried out on complete physical data blocks only, and defect data blocks must not be used by the file system. Logical file system blocks are used which are larger than the physical data blocks. According to the invention the error reporting mechanism of the NAND flash memories is exploited. The video data is not only written to the non-volatile flash memories, but is also written to corresponding buffer slots (LFSB) of a volatile SRAM or DRAM memory operating in parallel. The video data are kept in the volatile memory until the flash memory holding the respective data has reported that its program or write operation succeeded. Once this has taken place, the data within the volatile memory can be overwritten in order to save memory capacity. If the flash memory has reported an error, the respective block (FSBD) of data is marked bad and will not be overwritten until the end of the entire recorded take has been reached. At this time, the marked video data from the volatile memory are copied to spare flash-blocks within the flash memories.

14 Claims, 2 Drawing Sheets

U.S. PATENT DOCUMENTS

Figure 1:
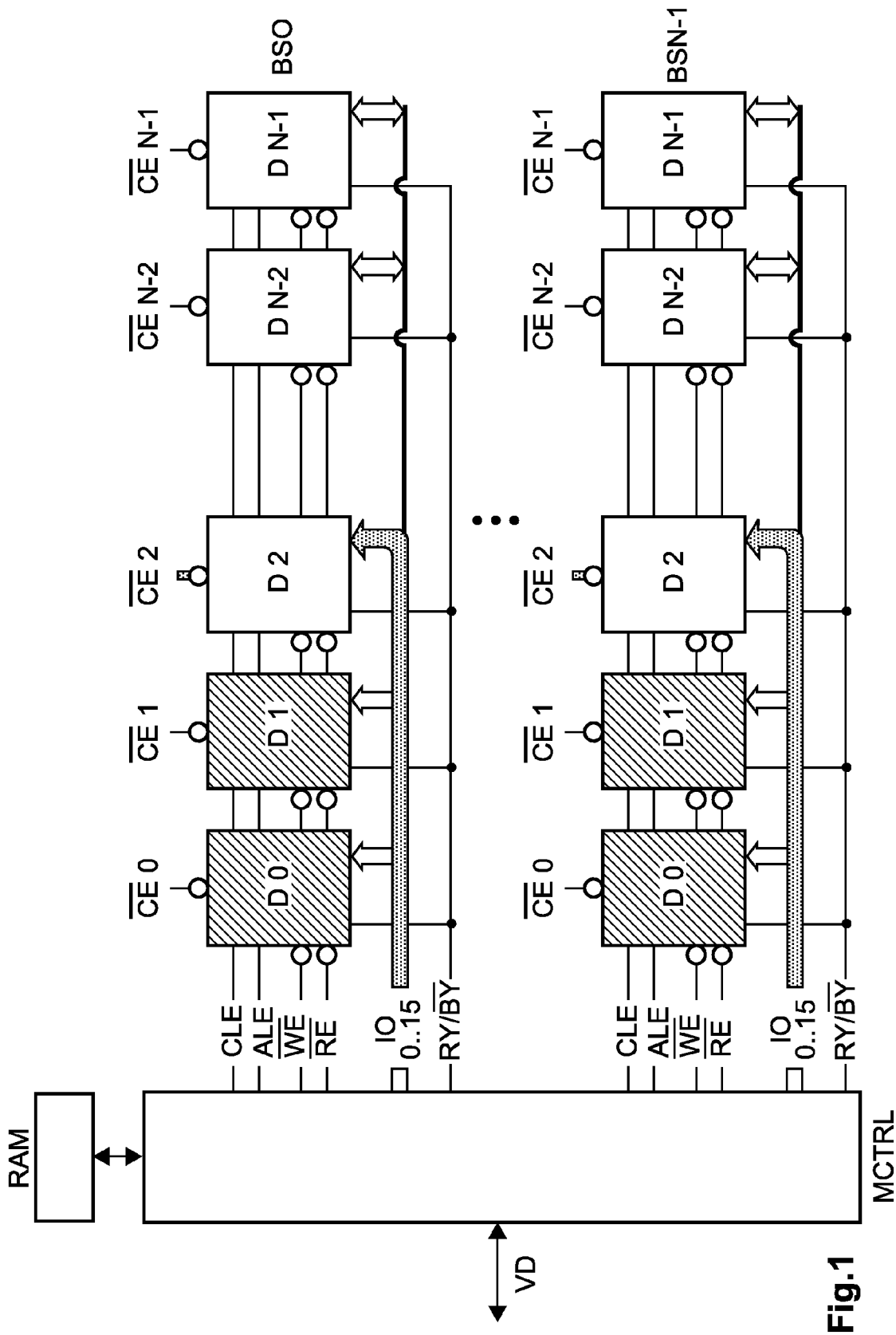

| | | |
|---|---|---|
| 6,584,014 B2 | 6/2003 | Hirosawa et al. |
| 6,757,800 B1 | 6/2004 | Estakhri et al. |
| 7,039,781 B2 * | 5/2006 | Iwata et al. ............ 711/165 |
| 7,334,080 B2 * | 2/2008 | Takase et al. ............ 711/103 |
| 2005/0073884 A1 | 4/2005 | Gonzalez et al. |
| 2005/0144516 A1 * | 6/2005 | Gonzalez et al. ............ 714/8 |
| 2005/0172066 A1 * | 8/2005 | Spencer et al. ............ 711/103 |
| 2007/0005874 A1 * | 1/2007 | Dodge ............ 711/103 |

FOREIGN PATENT DOCUMENTS

| | | |
|---|---|---|
| JP | 2000011677 | 1/2000 |
| JP | 2000020389 | 1/2000 |
| JP | 2000510634 | 8/2000 |
| JP | 2001265665 | 9/2001 |
| JP | 2002358246 | 12/2002 |
| WO | WO9944113 | 9/1999 |
| WO | WO2005036401 | 4/2005 |

* cited by examiner

METHOD AND SYSTEM FOR STORING LOGICAL DATA BLOCKS INTO FLASH-BLOCKS IN MULTIPLE NON-VOLATILE MEMORIES WHICH ARE CONNECTED TO AT LEAST ONE COMMON DATA I/O BUS

This application claims the benefit, under 35 U.S.C. §365 of International Application PCT/EP2006/060865, filed Mar. 20, 2006, which was published in accordance with PCT Article 21(2) on Oct. 19, 2006 in English and which claims the benefit of European patent application No. 05090111.5, filed Apr. 15, 2005.

The invention relates to a method and to a system for storing logical data blocks into flash-blocks in multiple non-volatile memories which are connected to at least one common data I/O bus, whereby data for defect flash-blocks are stored elsewhere.

BACKGROUND

For (professional) film and video recording or replaying in real-time digital high bandwidth video signals, e.g. HDTV signals, digital cinematography, very fast memories are required. For storage of streaming HD video data NAND flash memory based systems could be used. Flash memory devices are physically accessed in a page oriented mode, whereby one 'page' includes e.g. 1024 data words and related error correction code (ecc).

NAND flash memories have two basic disadvantages:
the write access is rather slow;
they have unmasked production defects and acquire even more defects during their lifetime. The required error handling is under user responsibility.

Erase operations on a specific flash memory can be carried out on certain-size data blocks only. These data blocks are denoted by the term "flash-block" in the following. A flash-block consists of e.g. 64 pages. Since a detection of defects in flash memory devices (e.g. NAND devices) takes place for instance during an erase operation, a defect in a page makes an entire flash-block unusable. Such defect flash-blocks must not be used by the file system.

A known approach for tackling sporadic defects during operation is to introduce redundancy, e.g. by a corresponding channel coding or by a data re-transmission.

INVENTION

For the recording of streaming video, the related file system must provide address values denoted "logical block numbers" of unused storage space under real-time conditions, and it must take care of not addressing defect memory blocks. In a high-definition video recording system, due to the slow write access, a high number of interleaved and parallel flash memory devices must be employed. This means that several flash devices are to be accessed in parallel and all devices on the same bus are to be accessed in subsequent order to sustain the required streaming bandwidth.

However, the above-mentioned approaches for introducing redundancy have the disadvantage of requiring additional bandwidth for the storage devices. But in a flash memory based streaming video recording system, adding bandwidth to the flash devices is the most critical and costly resource at all because it would lead to demand for additional parallelism, i.e. additional system size, power consumption and cost.

Access to NAND flash memories can take place using a 20 MHz bus clock. Most real-time critical is the write operation. After an entire page has been entered into a memory device, a 'program' command (i.e. a write command) is issued which initiates copying of data from a flash memory internal page register to the actual flash memory cells. Such page program operation requires 700 µs in the worst case. The page register must not be accessed during this time period. However, data transfer to the page registers of other flash memories on the same bus may take place during this time. Within such 700 µs time period, when using bus interleaving, data can be transferred to 10-15 other flash memories that are connected to the same bus.

Typical NAND flash memories provide a status information after each program or write operation for a page, whether or not the operation succeeded, i.e. whether or not a defect occurred.

A problem to be solved by the invention is to provide for a flash memory-based storage system, in case of writing error due to a memory data block defect, a corresponding error handling. This problem is solved by the method disclosed in claim 1. A storage system that utilises this method is disclosed in claim 2.

According to the invention the above error reporting mechanism is exploited. The video data is not only written to the non-volatile flash memories, but is also written to volatile one or more SRAM or DRAM memories operating in parallel with the flash memories. The parallel access to SRAM or DRAM is uncritical because such memory devices offer a more than sufficient bandwidth as compared to that of flash memories. The video data are kept in the volatile memory until the flash memories holding the respective data have reported that their program or write operation succeeded. Once this has taken place, the data within the volatile memory can be overwritten in order to save memory capacity. If a flash memory has reported an error, the respective logical block of data is marked 'bad' and will not be overwritten until the end of the entire recorded take has been reached. At this time, the busses to the flash memories are idle, and the entire bandwidth can be employed to first copy the marked data of the flash-block from the respective flash memory (i.e. the flash memory that had reported a defect) to spare flash-block or blocks within that flash memory, and then copy the corresponding erroneous page or pages from the SRAM or DRAM memory to the corresponding page or pages in the corresponding spare flash-block or blocks.

Advantageously, such parallel storage of streaming data into volatile RAM (SRAM or DRAM) does not waste bandwidth.

Preferably, the logical file system blocks and the physical memory blocks do not have the same size. A logical file system block is the combination of one flash-block from all flash memory devices used in the entire storage system. Such logical file system block becomes the smallest addressable system entity when using the file system tables. The file system uses separated tables for bad block remap and file allocation (FAT). The bad block mapping is kept on single flash-block level using 'block indirection tables', one block indirection table per flash memory device.

Only the writing into the flash memories is carried out on a page basis, whereby the same page number N in all flash memories forms a logical page N of the storage system.

The invention facilitates a fully transparent masking of flash memory defects acquired during recording without need for additional bandwidth to the flash memories. This saves system size, power consumption and costs. Additional SRAM/DRAM must be integrated into the storage system, but such additional memory is likely already present for other reasons.

In principle, the inventive method is suited for storing logical data blocks in a storage system that includes multiple non-volatile memories which are connected to at least one common data I/O bus, wherein each one of said non-volatile memories can be physically accessed by memory pages which each include multiple data words and each one of said non-volatile memories can be logically accessed by flash-blocks which each include multiple ones of said memory pages, said method including the steps:

storing page data blocks into flash-blocks of multiple non-volatile memories and in parallel into corresponding buffer slots in volatile memory means, in a circular buffer slot access sequence, whereby the respectively used storage capacity of said volatile memory means is smaller than the storage capacity of said non-volatile memories and whereby, after the last free buffer slot has been written, said sequence again starts with overwriting the first buffer slot, and whereby, if one or more of said non-volatile memories signal that, when recording a current page data block an error has occurred in that page data block, the corresponding current buffer slot in said volatile memory means—or a related table entry—is marked correspondingly and in the following turn or turns of said sequence said marked buffer slot or slots are skipped such that the data stored therein are kept unchanged;

after a take has been recorded into said non-volatile memories, copying flash-block data of said volatile memory means that contain erroneous page data into free flash-blocks in the corresponding flash memories, and checking which buffer slots in said volatile memory means or which related table entries are marked and copying corresponding page data block data from said marked buffer slots of said volatile memory means into the corresponding pages of said free flash-blocks in said non-volatile memories.

In principle the inventive storage system stores logical data blocks in multiple non-volatile memories which are connected to at least one common data I/O bus, wherein each one of said non-volatile memories can be physically accessed by memory pages which each include multiple data words and each one of said non-volatile memories can be logically accessed by flash-blocks which each include multiple ones of said memory pages, said storage system including:

multiple non-volatile memories;

volatile memory means;

means for storing page data blocks into flash-blocks of multiple non-volatile memories and in parallel into corresponding buffer slots in volatile memory means, in a circular buffer slot access sequence, whereby the respectively used storage capacity of said volatile memory means is smaller than the storage capacity of said non-volatile memories and whereby, after the last free buffer slot has been written, said sequence again starts with overwriting the first buffer slot, and wherein, if one or more of said non-volatile memories signal that, when recording a current page data block an error has occurred in that page data block, the corresponding current buffer slot in said volatile memory means—or a related table entry—is marked correspondingly and in the following turn or turns of said sequence said marked buffer slot or slots are skipped such that the data stored therein are kept unchanged;

means which, after a take has been recorded into said non-volatile memories, copy flash-block data of said volatile memory means that contain erroneous page data into free flash-blocks in the corresponding flash memories, and check which buffer slots in said volatile memory means or which related table entries are marked, and copy corresponding page data block data from said marked buffer slots of said volatile memory means into the corresponding pages of said free flash-blocks in said non-volatile memories.

Advantageous additional embodiments of the invention are disclosed in the respective dependent claims.

DRAWINGS

Figure 3:
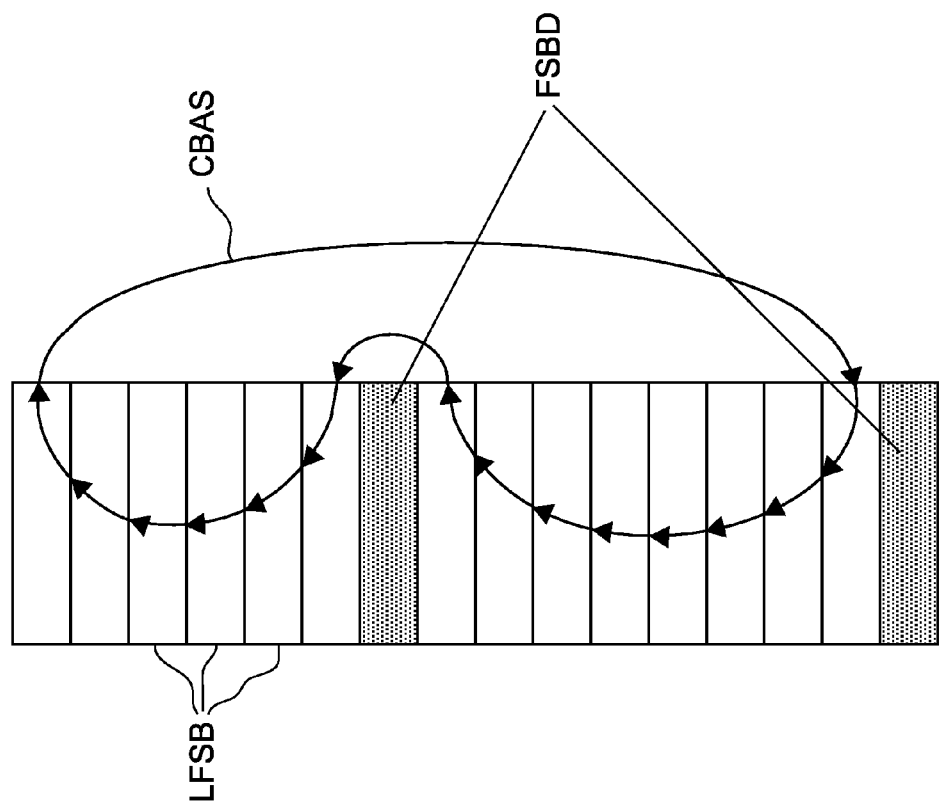
Figure 2:
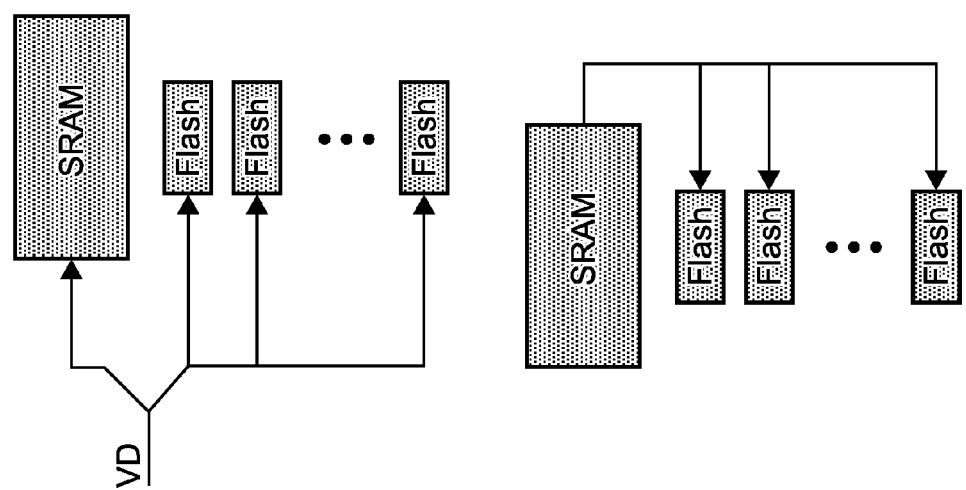

Exemplary embodiments of the invention are described with reference to the accompanying drawings, which show in:

FIG. 1 block diagram of the inventive memory system;

FIG. 2 principle of parallel catching of data to be recorded, and subsequent copy to spare flash-blocks;

FIG. 3 principle of SRAM memory organisation and address sequence.

EXEMPLARY EMBODIMENTS

The following NAND flash memories can be used: Samsung K9K2G16UOM-YCB000 (2 Gbit, 16 bit oriented), K9W4G08U0M-YCB000 (4 Gbit, 8 bit oriented), Toshiba TH58NVG2S3BFT00 (4 Gbit, 8 bit oriented) and MICRON MT29G08AAxxx (2 Gbit, 8 bit oriented), MT29G16AAxxx (2 Gbit, 16 bit oriented).

A bus structure for the connection of the memory devices is shown in FIG. 1. Each bus BS0, BS1, . . . , BSN-1 features a number of 28 flash memories D0, D1, D2, . . . , DN-2, DN-1, whereby 8 busses are operating in parallel, which equals 224 flash memory devices in total. Each bus BS0, BS1, . . . , BSN-1 can write to, or read from, the memory devices 16-bit words IO0 . . . 15 and operating at 20 MHz. These data inputs/outputs are used to input command, address and data, and to output data during read operations. The I/O pins float to high-s when the chip is deselected or when the outputs are disabled.

$\overline{RY/BY}$ is a ready/busy output indicating the status of the device operation. When low, it indicates that a program, erase or random read operation is in process and returns to high state upon completion. It is an open drain output and does not float to high-s condition when the chip is deselected or when outputs are disabled.

This status of the device operation and/or data from IO0 . . . 15 can be used to determine whether or not a write defect has occurred.

$\overline{RE}$ is a read enable signal whereas $\overline{WE}$ is a write enable signal. The read enable input is a serial data-out control and, when active, drives the data onto the I/O bus. Data is valid after the falling edge of read enable which also increments an internal column address counter by one. The write enable input controls writes to the I/O port. Commands, address and data are latched on the rising edge of the write enable pulse.

The command latch enable input CLE controls the activating path for commands sent to a command register. When active high, commands are latched into the command register through the I/O ports on the rising edge of the write enable signal. The address latch enable input ALE controls the activating path for address to the internal address registers. Addresses are latched on the rising edge of the write enable signal with ALE high.

$\overline{CE0}$, $\overline{CE1}$, $\overline{CE2}$, . . . , $\overline{CEN-2}$ and $\overline{CEN-1}$ denote a chip enable input and are used for device selection control. When the device is in the busy state, CE high is ignored and the device does not return to a standby mode in a program or erase operation.

A memory or micro controller unit MCTRL controls all flash memory devices using the above-listed signals. Controller MCTRL receives video data VD for recording, or outputs recorded video data VD for replay. An additional memory means RAM (SRAM and/or DRAM) is connected to controller unit MCTRL and stores the current video data, the required file system and defect block remap tables.

When writing, each flash memory is accessed page by page in each flash-block, and flash-block by flash-block. The bank of memories is accessed per page, memory by memory.

Preferably SRAM (e.g. 2*2 GBit) is employed in order to keep the interfacing as simple as possible. The SRAM is organised as 64-bit bus at 80 MHz—hence providing identical bandwidth. All buffer management takes place on logic file system block level, whereby the logical blocks are much larger than a flash-block. The flash memories report their error status after each write operation on page level.

The SRAM can hold up to 16 logic file system blocks. As a consequence, the system can mask at least 16 defects, or even more if multiple defects fall into the same logic file system block. When considering the error statistics of flash memory devices, the resulting mean time between failures of the inventive storage system advantageously is far beyond user concern. The same SRAM can also be used to hold the above-mentioned file system and error handling tables.

FIG. 2 shows in its top part the parallel writing of (page) video data VD to be recorded into the flash memories and into the SRAM. In its bottom part FIG. 2 depicts the copying of (page) video data from the SRAM to spare flash-blocks in case a write error occurred during the recoding into the flash memories. That copy operation is performed immediately after a corresponding take recording operation has been finished.

The principle of the SRAM memory organisation in FIG. 3 shows multiple buffer slots each containing a logical page data block LFSB. The respective storage area of the SRAM is filled slot by slot with the incoming video data, which processing is depicted by the current buffer address sequence CBAS. After the last free buffer slot has been written, the sequence again starts with overwriting the first buffer slot. If the flash memory bank signals that, when recording a current logical page data block, an error has occurred in a flash-block the corresponding current slot in the SRAM (or a respective table) is marked correspondingly. The grey or hatched slots mark logical file system blocks FSBD containing data corresponding to defect flash-blocks of the related flash memories. In the next turn the SRAM slot access sequence will skip that marked buffer slot (and all other marked slots) such that the data stored therein are kept unchanged.

After a take has been recorded into the flash memory bank D0, D1, D2, . . . , DN-2, DN-1, the file allocation and bad block remap tables are used to check which flash blocks in the flash memories can store further video data. The video data stored in the flash-blocks containing one or more page errors are thereafter copied into the corresponding free (non-defect) flash-blocks in the flash memories. Then, the required error-free page data intermediately stored in the SRAM from the marked slots of the SRAM are copied into the corresponding erroneous pages in the flash-block data that have just been stored before in the free flash-blocks in the flash memories.

According to the logical block layout described above, a logical file system block contains 28 Mbytes, whereas typical state-of-the-art file systems feature block sizes in Kbytes range. The file system contains only e.g. 2048 logical blocks. The maximum number of files that may be stored on the storage system is 255 plus one extra file representing an empty logical block list. However, a typical quantity is <20. In a worst case this would mean that partially filled logical blocks at the end of each file may lead to unused space amounting to 12.5% of the total storage capacity, but in practise a value of <2% is more realistic.

When reading video data from the storage system the replacement flash-block data are read from the flash memories, instead of the erroneous flash-blocks, controlled by the logical file system.

The invention claimed is:

1. Method for storing logical file system blocks in a storage system that includes:
    multiple non-volatile memories which are connected to at least one common data I/O bus, wherein at least a plurality of said non-volatile memories are physically accessed on a memory page basis, where each memory page includes multiple data words, and each one of said at least a plurality of non-volatile memories are logically accessed on a flash-block basis, which where each flash-block includes multiple ones of said memory pages, and wherein a logical file system block is the combination of one flash-block from all non-volatile memories used in said storage system, and
    volatile memory means which hold multiple buffer slots each containing a logical file system block;
said method comprising the steps:
    storing page data into logical file system blocks of the multiple non-volatile memories and in parallel into corresponding buffer slots in the volatile memory means, in a circular buffer slot access sequence, whereby the respectively used storage capacity of said volatile memory means is smaller than the storage capacity of said non-volatile memories and whereby, after the last free buffer slot has been written, said sequence again starts with overwriting the first buffer slot,
    and whereby, if one or more of said non-volatile memories signal that, when recording current page data an error has occurred, the corresponding current buffer slot in said volatile memory means or a related table entry is marked correspondingly and in the following turn or turns of said sequence said marked buffer slot or slots are skipped such that the data stored therein are kept unchanged;
    after a take has been recorded, copying flash-block data of said non-volatile memory means that contain erroneous page data into free flash-blocks within the same non-volatile memory, and checking which buffer slots in said volatile memory means or which related table entries are marked and copying corresponding page data from said marked buffer slots of said volatile memory means into the corresponding memory pages of said free flash-blocks in said non-volatile memories.

2. Method according to claim 1, wherein said non-volatile memories are NAND flash memories.

3. Method according to claim 1, wherein said storage system stores or replays streaming video data in real-time.

4. Method according to claim 1, wherein access to said non-volatile memories is performed in circular subsequent order.

5. Method according to claim 2 wherein, in order to mask defects in storage cells of said NAND flash memories, to each one of said NAND flash memories a block indirection table is assigned that maps logical data block address values to physical address values related to non-defect flash-blocks.

6. Method according to claim 5, wherein said storage system includes micro or memory control means which control said at least one common data I/O bus and to which control means RAM memory means are connected which store said block indirection tables.

7. Method according to claim 1, wherein said RAM memory means is an SRAM memory.

8. Storage system for storing logical file system blocks in multiple non-volatile memories which are connected to at least one common data I/O bus, wherein at least a plurality of said non-volatile memories are physically accessed on a memory page basis, where each memory page includes multiple data words, and each one of said at least a plurality of non-volatile memories are logically accessed on a flash-block basis, where each flash-block includes multiple ones of said memory pages, and wherein a logical file system block is the combination of one flash-block from all non-volatile memories used in said storage system, said storage system comprising:

multiple non-volatile memories;

volatile memory means which hold multiple buffer slots each containing a logical file system block;

means for storing page data into flash logical file system blocks of the multiple non-volatile memories and in parallel into corresponding buffer slots in the volatile memory means, in a circular buffer slot access sequence, whereby the respectively used storage capacity of said volatile memory means is smaller than the storage capacity of said non-volatile memories and whereby, after the last free buffer slot has been written, said sequence again starts with overwriting the first buffer slot, and wherein, if one or more of said non-volatile memories signal that, when recording a current page data an error has occurred, the corresponding current buffer slot in said volatile memory means or a related table entry is marked correspondingly and in the following turn or turns of said sequence said marked buffer slot or slots are skipped such that the data stored therein are kept unchanged;

which means, after a take has been recorded, copy flash-block data of said non-volatile memory means that contain erroneous page data into free flash-blocks within the same non-volatile memory, and check which buffer slots in said volatile memory means or which related table entries are marked, and copy corresponding page data from said marked buffer slots of said volatile memory means into the corresponding memory pages of said free flash-blocks in said non-volatile memories.

9. System according to claim 8, wherein said non-volatile memories are NAND flash memories.

10. System according to claim 8, wherein said storage system stores or replays streaming video data in real-time.

11. System according to claim 8, wherein access to said non-volatile memories is performed in circular subsequent order.

12. System according to 9, wherein, in order to mask defects in storage cells of said NAND flash memories to physical address values related to non-defect flash-blocks.

13. System according to claim 12, wherein said storage system includes micro or memory control means which control said at least one common data I/O bus and to which control means RAM memory means are connected which store said block indirection tables.

14. System according to claim 8, wherein said RAM memory means is an SRAM memory.

* * * * *